Figure 1:
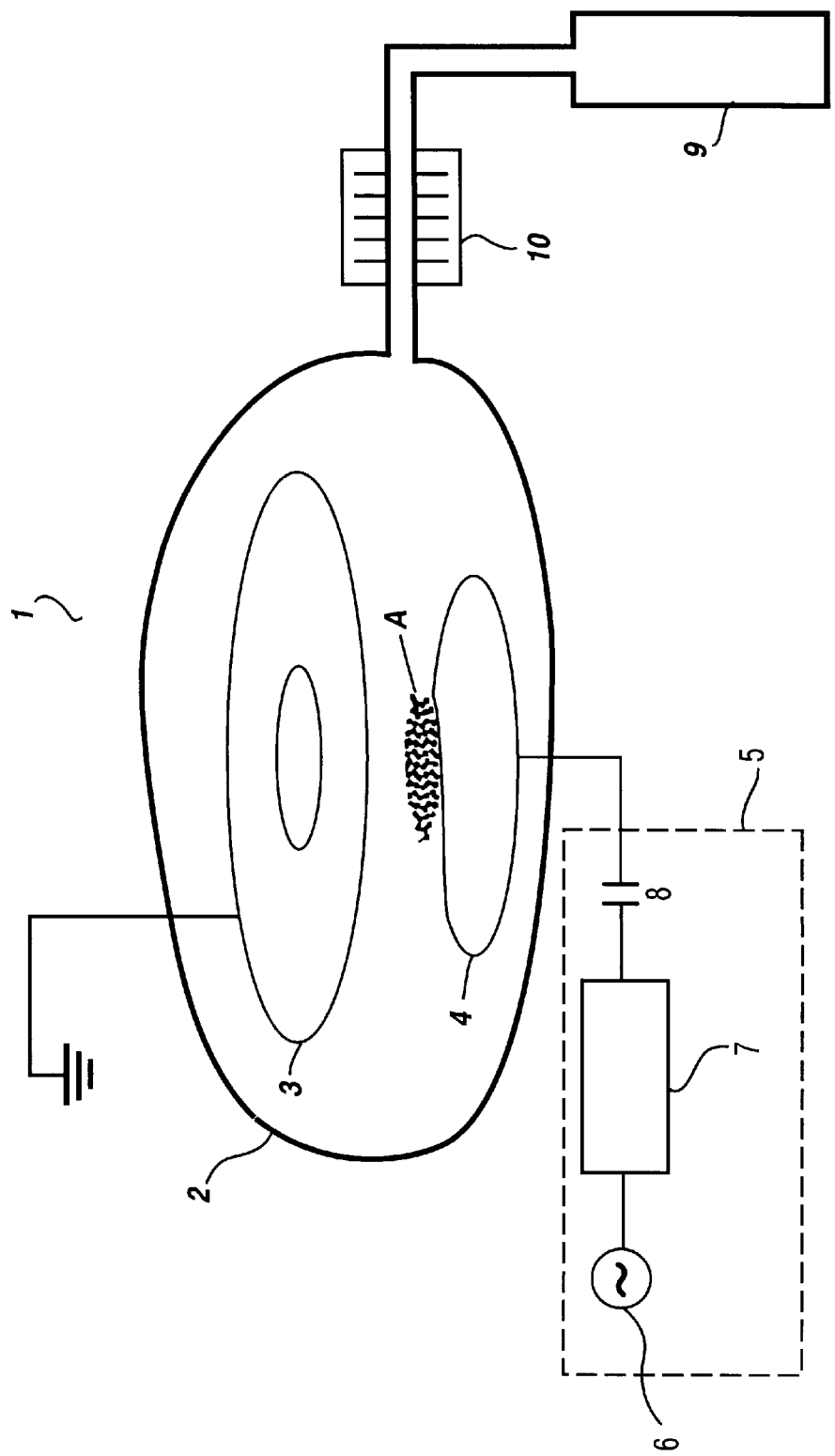

United States Patent [19]
Bingham et al.

[11] Patent Number: 6,136,256
[45] Date of Patent: Oct. 24, 2000

[54] METHOD AND APPARATUS FOR CONTROLLING DUST PARTICLE AGGLOMERATES

[75] Inventors: Robert Bingham, Oxford, United Kingdom; Vadim N. Tsytovich, Moscow, Russian Federation

[73] Assignee: Council for the Central Laboratory of The Research Councils, United Kingdom

[21] Appl. No.: 09/101,930

[22] PCT Filed: Jan. 22, 1997

[86] PCT No.: PCT/GB97/00182

§ 371 Date: Oct. 7, 1998

§ 102(e) Date: Oct. 7, 1998

[87] PCT Pub. No.: WO97/27614

PCT Pub. Date: Jul. 31, 1997

[30] Foreign Application Priority Data

Jan. 22, 1996 [GB] United Kingdom .................... 9601208

[51] Int. Cl.[7] ............................ B29C 59/14; B29C 59/16; B29C 33/02

[52] U.S. Cl. ...................... 264/437; 264/483; 118/723 R; 425/143

[58] Field of Search ............................... 264/483, 39, 406, 264/437, 405, 446, 455; 156/345; 425/7, 143; 118/723 R, 724, 723 MW

[56] References Cited

U.S. PATENT DOCUMENTS

| | | | |
|---|---|---|---|
| 3,847,652 | 11/1974 | Fletcher et al. | 264/483 |
| 4,019,842 | 4/1977 | Forgensi et al. | 264/13 |
| 4,246,208 | 1/1981 | Dundas | 264/14 |
| 5,350,454 | 9/1994 | Ohkawa | 118/723 R |
| 5,769,953 | 6/1998 | Yoshikawa et al. | 264/483 |

FOREIGN PATENT DOCUMENTS

| | | |
|---|---|---|
| 0 425 419 | 5/1991 | European Pat. Off. . |
| 0 425 419 A3 | 5/1991 | European Pat. Off. . |
| 195 02 865 | 8/1995 | Germany . |
| 195 02 865 A1 | 8/1995 | Germany . |

OTHER PUBLICATIONS

Dusty Plasmas—'95 Workshop On Generation, Transport, And Removal of Particles in Plasmas, Wickenburg, AZ, USA, Oct. 1–7, 1995, vol. 14, No. 2, ISSN 0734–2101, Journal of Vacuum Science & Technology A (Vacuum, Surfaces, And Films), Mar.–Apr. 1986, AIP For American Vacuum Soc, USA, pp. 644–648, XP002029779 Brattli A et al., "Cooling by dust in levitation experiments and its effect on dust cloud equilibrium profiles" see the whole document.

XP 2029779—Cooling by dust in;levitation experiments and its effect on dust cloud equilibrium pofiles; A Bratti and O. Havnes; Auroral Observatory, University of Tromsb, N–9037 Tromsb, Norway; J. Cac. Scl. Technol. A 14(2), Mar./Apr. 1996; 0734–2101/96/14(2)/644/5/$10.00; ©1996 American vacuum Society.

*Primary Examiner*—Angela Ortiz
*Attorney, Agent, or Firm*—Nixon & Vanderhye P.C.

[57] ABSTRACT

The formation of dust particle agglomerates within a plasma reactor is controlled through adjustment of the ratio of the temperatures of two particle species within the plasma. Adjustment of the ratio of temperatures is achieved by means of one or more temperature control devices which alter the temperature of one particle species with respect to the temperature of a second particle species. The temperature of a neutral particle species may be adjusted with respect to the temperature of dust particles present within the plasma by heating or cooling the neutral gas supplied to the plasma chamber. Alternatively, the temperature of the dust particles may be raised or lowered with respect to the neutral gas particles by heating or cooling the substrate from which the dust particles emerge. In an alternative embodiment, dust particle agglomeration can be reduced by passing a shock wave transversely through the plasma region thereby increasing the temperature of plasma ions with respect to the temperature of the plasma electrons. Dust particle agglomeration may be used to provide additional protection for exposed surfaces in a plasma environment and is particularly suited to providing protection against energetic particles and radiation.

18 Claims, 2 Drawing Sheets

METHOD AND APPARATUS FOR CONTROLLING DUST PARTICLE AGGLOMERATES

The present invention relates to dust particle agglomerates. In particular the present invention relates to controlled formation and destruction of such agglomerates as well as to applications of the agglomerates.

The accumulation of dust particles to form agglomerates or clusters, observed during the etching of silicon wafers, has proven to be a major problem in the commercial manufacture of silicon chips. The dust particles which are produced during the etching process usually form agglomerates of around micron size (e.g. 10 microns) which is of the same order as the thickness of the etching patterns. Larger agglomerates of between 100 and 1000 microns also have been observed. These dust particle agglomerates tend to fall into the etching patterns destroying the circuit being fabricated on the wafer and is a major cause of wastage in the industry. To date, only a poor theoretical and experimental understanding of how or why the agglomerates form has been developed.

Following work carried out by the inventors in the study of space plasmas it has been realised that this provides an insight to the forces involved in the formation of dust particle agglomerates and h as enabled methods for the controlled formation and destruction of such agglomerates to be developed. Hence, the present invention provides a method of and the conditions for controlled fabrication of dust particle agglomerates as well as a method of and the conditions for controlled destruction of such agglomerates. The present invention further identifies uses of dust particle agglomerates.

The present invention provides a method of controlling dust particle agglomeration in a plasma comprising adjusting the ratio of temperatures of first and second particle species within the plasma.

Preferably, the ratio of temperatures is adjusted by increasing or decreasing the temperature of the first of the particle species without substantially altering the temperature of the second of the particle species.

In a first embodiment of the invention the ratio of neutral gas particle temperature with respect to dust particle temperature is adjusted. The neutral gas particle temperature may be adjusted by heating or cooling the neutral gas supplied to the plasma. Alternatively, the dust particle temperature is adjusted by heating or cooling the source of the dust particles.

Additionally, movement of dust particle agglomerates formed within the plasma may be controlled preferably by the application of external electric and magnetic fields which are preferably substantially orthogonal.

In a second embodiment dust particle agglomeration is reduced by reducing the ratio of the plasma electron temperature to the plasma ion temperature. Preferably, the ratio is reduced by increasing the plasma ion temperature and ideally the plasma ion temperature is increased so that it is substantially equal to the plasma electron temperature.

The plasma ion temperature may be increased by passing one or more stock waves through the plasma by means of a high pressure gas discharge, a pulsed electron beam or RF injection.

In a further aspect the present invention provides apparatus for controlling formation of dust particle agglomerates in a plasma comprising a plasma containment vessel, plasma generation means including one or more electrodes and temperature control means for controlling the ratio of temperatures of first and second particle species within the plasma.

Preferably, the temperature control means comprises a heat exchanger device which may be in thermal contact with a supply of neutral gas to the plasma containment vessel or may be in thermal contact with the source of dust particles.

Alternatively, the temperature control means may include heat radiative material located within the plasma containment vessel. Separately, the temperature control means may comprise a shock wave generator, means for directing the shock wave through the plasma and valve means for controlling the period of the shock waves through the plasma. Preferably, the shock wave generator is arranged so that the shock waves propagate transversely of the applied RF plasma field. The shock wave generator may comprise high pressure gas discharge means or a pulsed electron beam generator or separate RF injection means.

In a still further aspect the present invention provides a method of generating shielding for exposed surfaces in a plasma containment vessel comprising providing a source of dust particles, adjusting the ratio of temperatures of first and second particle species within the plasma to generate dust particle agglomerates and positioning the dust particle agglomerates adjacent the exposed surfaces to be shielded.

It is to be understood that in the context of this document reference to dust particles is intended as reference to microscopic, for example sub-micron, particles and molecules of any matter. Solely for the purpose of example, matter which forms dust particle agglomerates includes silicon, silane, aluminium, glass, melamine, formaldehyde and carbon.

Figure 2:
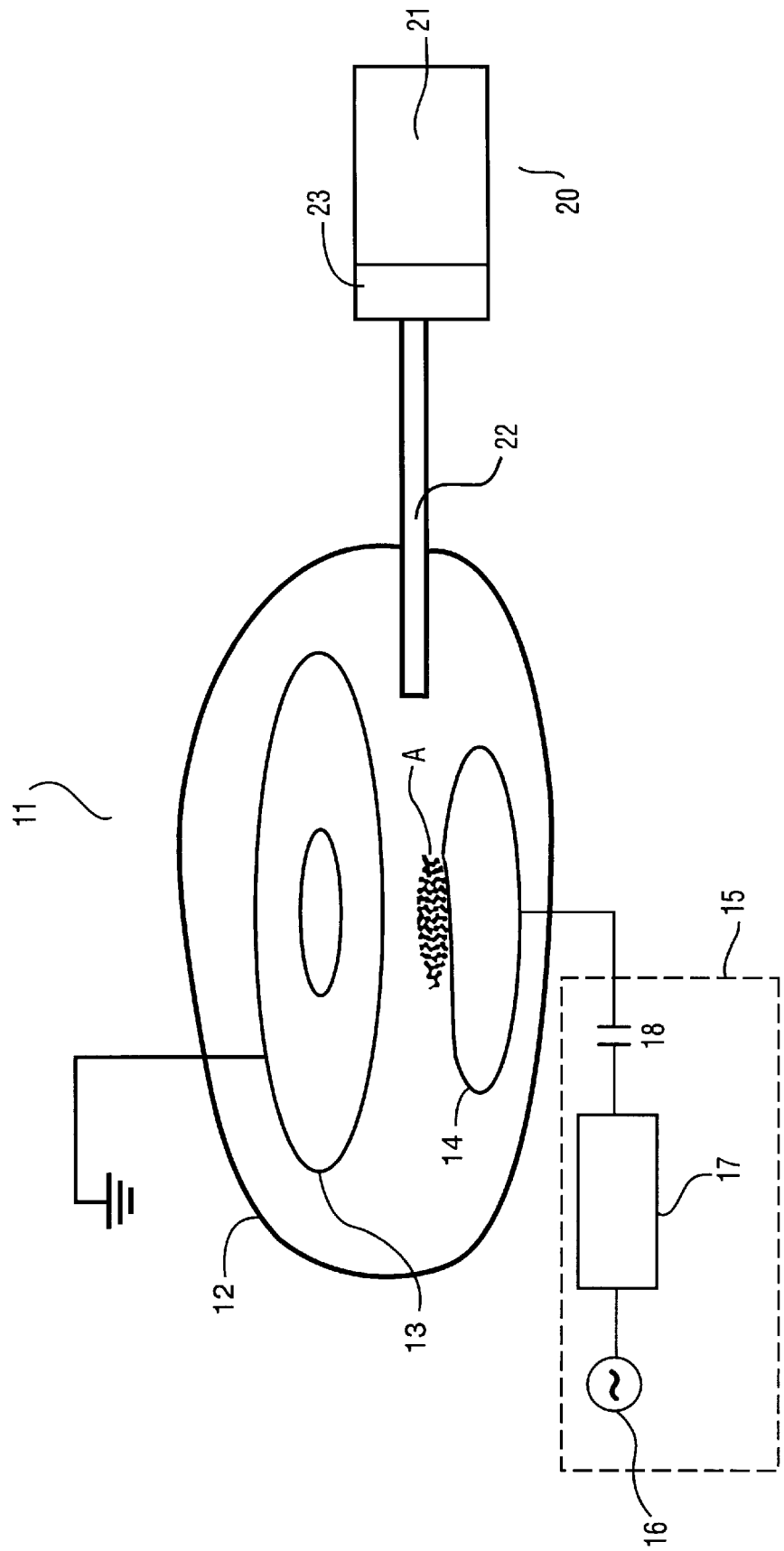

A discussion of the forces believed to underlie the formation of dust particles agglomerates follows to assist in a better understanding of the present invention. Apparatus for and methods of controlling the formation of dust particle agglomerates are also described with reference to the accompanying drawings, in which:

FIG. 1 is a schematic diagram of plasma reactor apparatus in accordance with the present invention; and FIG. 2 is a schematic diagram of alternative plasma reactor apparatus in accordance with the present invention.

In estimating the binding energy of dust particle agglomerates a simple model is employed in which it is assumed that the radius a of spherical dust particles is significantly less than the Debye shielding length $d_i$, i.e. a<<d, and that the separation r of the dust particles is much greater than the Debye shielding length $d_i$, i.e. r>>$d_i$. This second assumption assists in generating an analytical expression for the forces acting on the dust particles, however it is found that the expressions derived from this analysis are not dependent on the separation of the dust particles and so r is taken to be arbitrary. It is believed that the forces between dust particles within a plasma reactor which causes the particles to form agglomerates is largely dependent upon two effects; an attractive bombardment force acting between the individual particles as a result of the plasma particles bombarding the dust particles; and a Coulomb repulsive force acting between the dust particles. The attractive bombardment force results from the shielding effect of one dust particle with respect to an adjacent particle which causes the flux of charged plasma particles incident on the dust particle to become asymmetric generating a net momentum transfer to the dust particle. This momentum is mainly transferred through ion and neutral particle bombardment due to their greater mass rather than electrons.

The attractive bombardment force and the Coulomb repulsive force can be described by potentials $U_a$ and $U_c$ respectively, as follows:

$$U_c = \frac{Z_d^2 e^2}{r}; \quad U_a = -\eta_a \cdot \frac{a^2}{d_i^2} \cdot \frac{Z_d^2 e^2}{r} \quad (1)$$

where $\eta_a$ is a coefficient consisting of three parts: $\eta_a = \eta_b + \eta_c + \eta_n$ (2), with $\eta_b$ representing direct charged plasma particle bombardment, $\eta_c$ representing plasma screening and $\eta_n$ representing neutral particle bombardment.

It is clear from this equation that it is necessary for $\eta_a \gg 1$ in order for the attractive bombardment force to dominate, as we have assumed $a \gg d_i$.

From equation (2):

$$\eta_b = \frac{k_i}{2\sqrt{\pi}} \cdot \left(\frac{aT_i}{Z_d Z_i e^2}\right)^2 \int_{10}^{\infty} \left(1 + \frac{Z_i e |\phi_0|}{T_i y^2}\right)^{5/2} \cdot e^{-y^2} y^4 \, dy \quad (3)$$

where $k_i$ is the ion attachment coefficient, $v_0 = (a/d_i) \cdot \sqrt{(Z_i e |\phi_0|)/T_i}$ and y=selectively. In fact in a plasma environment $v_{ei}$ $n/T_e^{3/2}$ and temperature $T_i$ the ion charge is $Z_i e$ (e>0) and $|\phi_0|$ is the floating potential of the dust particles.

$$\eta_c = \frac{k_i}{4\sqrt{\pi}} \int_O^{\infty} \left(1 + \frac{Z_i e |\phi_0|}{T_i y^2}\right) \ln[\beta] \cdot e^{-y^2} \, dy \quad (4)$$

$$\text{where } \beta = \left(d^2 + \frac{Z_d^2 Z_i^2 e^4}{4T_i^2 y^4}\right) / \left[a^2 \left(1 + \frac{Z_i e |\phi_0|}{T_i}\right) + \frac{Z_d^2 Z_i^2 e^4}{4T_i^2 y^4}\right] \quad (5)$$

For neutral particles, it is assumed that the neutrals attach themselves onto the dust particles with attachment coefficient $k_n$, the temperature of the neutral particles before attachment being $T_n$ and after thermalisation of the surface of the dust particle, the dust particle temperature being $T_d$.

$$\eta_n = \frac{k_n}{8(e|\phi_0|/T_e)^2} \cdot \frac{T_n T_i}{T_e^2} \cdot \frac{n_n}{n_i} \left(-\sqrt{\frac{T_d}{T_n}}\right) \quad (6)$$

where $n_n$ is the neutral density and $n_i$ is the ion density. Thus, $n_i/n_n$ describes the degree of ionization which is usually of the order of $10^{-5}$–$10^{-6}$ where neutral particle species are employed in the plasma chamber.

From these equation two separate criteria for dust particle agglomeration depending upon the plasma environment are identified, namely:

$$\eta_n \gg \eta_b + \eta_c, \text{ where } (d_i/a)^2 > (d_i/a)_{critical}^2 = \eta_n \quad (7)$$

and $$\eta_n \ll \eta_b + \eta_c, \text{ where } (d_i/a)^2 > (d_i/a)_{critical}^2 = \eta_b + \eta_c \quad (8)$$

Equation (7) applies to situations in which a neutral gas is employed within the plasma reactor. Considering equation (7), from equation (6) it is seen that $\eta_n$ is positive for $T_d < T_n$ which in turn means that agglomerate formation only occurs where $T_n > T_d$. FIG. 1 illustrates a plasma reactor 1 of the type typically employed in silicon chip manufacture. The plasma reactor 1 comprises a chamber 2 in which a pair of parallel electrode plates 3, 4 are mounted. One of the electrode plates 3 is grounded whilst the second of the electrode plates 4, the driven electrode, is connected to an RF power source 5 which conveniently includes an RF generator 6 and a matching network 7 which are connected through an isolating capacitor 8 to the driven electrode plate 4. Usually, the wafer to be etched is located on the grounded electrode plate 3. Of course alternative arrangements of the electrodes and/or wafer may be employed as appropriate. Typically, the chamber 2 is evacuated to pressures in the region of 2 mBars.

The RF power supply 5 typically drives the driven electrode plate 4 at a frequency of 13.56 MHz at a power, before losses, of about 4.5 W which results in an RF power coupled to the plasma generated within the chamber of between 0.1 and 0.5 W. Under these conditions a non-isothermal plasma is generated in which the electron temperature ($T_e$) is greater than ion temperature ($T_i$), i.e. $T_e \gg T_i$. In commercial plasma etching operations typically $T_e/T_i \approx 1 \times 10^{-2}$.

The figures given above for operation of the plasma reactor 1 are typical values, it will be understood that the plasma reactor may be operated under conditions different to those described above whilst still enabling control of dust particle agglomerate formation as described below.

A supply 9 of a neutral gas such as helium is connected via a pump to the plasma chamber 2 so that the neutral gas circulates within the chamber. The neutral gas particles are thus the dominant particle species within the chamber 2. Usually, the ratio of neutral gas density $n_n$ to ion density $n_i$ is of the order of $10^5$–$10^6$.

The supply 9 of neutral gas also includes a temperature control device 10 for controlling the temperature of the neutral gas supplied to the chamber 2. The temperature control device 10 may conveniently be in the form of heat exchanger coils or fins thermally in contact with the gas conduit connecting the gas supply 9 to the inlet to the plasma chamber. Alternative temperature control devices 10, employing lasers for example, may also be used. As set out above, adjustment of the temperature of the neutral gas $T_n$ supplied to the chamber 2 with respect to the temperature of the dust particles $T_d$ within the plasma reactor affords control of the growth of dust particle agglomerates. Where the neutral gas is heated so that the temperature of the gas is greater than the dust particle temperature, i.e. $T_n > T_d$, growth of agglomerates is enabled and agglomerates A form in the plasma region between the electrode plates. On the other hand, if the neutral gas is cooled so that $T_n < T_d$ then formation of dust particle agglomerates is prevented. The extent of the difference between the temperatures of the neutral gas and the dust particles determines the number and size of the agglomerates which are formed.

As it is the ratio of the temperatures which provides control of dust particle agglomeration, it is also possible to control agglomeration through control of the dust particle temperature $T_d$ instead of or in addition to controlling the temperature of the neutral gas. For example, the temperature control device 10 may be in the form of a heat exchanger pad thermally in contact with the wafer substrate. This enables the temperature of the substrate to be controlled which in turn controls the temperature of the dust particles produced during etching of the substrate.

In a further alternative, the temperature control device may be in the form of an infra-red radiation emitting material mounted on one or more of the walls of the plasma chamber. This material is used to directly heat the dust particles within the plasma chamber. For greater efficiency when heating the dust particles, the wavelength of the infra-red radiation is preferably of the order of the dust particle size. Preferably, the material is mounted within the chamber, alternatively the material may be mounted externally of the chamber adjacent one or more regions of the chamber walls which are substantially transparent to infra-red radiation.

It will of course be understood that other temperature control devices for adjusting the ratio of the dust particle temperature with respect to the neutral gas temperature may alternatively be employed.

Once agglomerates are formed within the plasma chamber, deposition of the dust particle agglomerates may be controlled employing the principle of magnetohydrodynamics. By applying orthogonal electric (E) and magnetic (B) fields across the region where the agglomerates form, the agglomerates experience a drift velocity perpendicular to the applied fields. The drift velocity $v_D$ of the agglomerates is determined by the magnitude of the fields in accordance with the following equation:

$$v_D = \frac{EB}{|B|^2} \cdot \sin\theta \qquad (9)$$

Where ( ) is the angle between the E and B fields, preferably 90°. Hence, means (not shown) for applying electric and magnetic fields across the plasma region are preferably provided for controlled deposition and/or collection of the agglomerates.

Considering equation (8), from equations (3), (4) and (5) it is seen that $\eta_b$ and $\eta_c$ contain the ratio $T_i/T_e$ to some high power. FIG. 2 shows an alternative plasma reactor 11 for preventing the formation of dust particle agglomerates in an environment where the number of neutral gas particles in negligible, i.e. an environment for which equation (8) applies. The plasma reactor 11 is similar to that of FIG. 1 and includes a chamber 12 in which are located opposed electrode plates 13, 14. One of the electrode plates 13 is connected to ground whilst the other of the electrode plates 14 is connected to an RF generator 15 which is identical to the RF generator of FIG. 1. The temperature of the dust particles and plasma ions is generally kept to around room temperature, i.e. 310 K.

A temperature control device 20 is again provided to control the formation of dust particle agglomerates between the electrode plates. However, as the plasma ions and electrons are the dominant particle species, the second criteria for agglomeration i.e. equation (8) applies. Hence, in this arrangement the temperature control device 20 is used to control the ratio of the plasma electron temperature $T_e$ with respect to the plasma ion temperature $T_i$. The temperature control device is preferably in the form of a shock wave supply 20 consisting of a high pressure gas generator 21 connected to a discharge nozzle 22 having a valve 23. The shock wave supply 20 and the plasma reactor 11 operate in the absence of an externally applied magnetic field. The discharge nozzle 22 is arranged so as to direct shock waves produced by the generator 21 across the plasma region in the chamber 12. Shock waves produced by the generator 21 thus travel through the charged atmosphere in the chamber transversely of the applied RF field between the electrode plates 13, 14. The period of the shock waves is controlled by the valve 23. The duration of the shock wave is determined in dependence on the plasma frequency $\omega_p$, the dust particle size or grain size a, and the Debye shielding length $d_i$ and is of the order of $$(\omega_p(a/d_i)^{-1} \qquad (10)$$

The separation of the shock waves is determined in dependence on the ratio of the distance to be travelled by the shock wave L, (in the case of plasma etching, the length of the chip) and the velocity of the shock save $v_{shock}$.

The shock waves which are generated heat the plasma ions, without significantly increasing the plasma electron temperature, which prevents or at the very least slows down the formation of the agglomerates. The shock waves also exert an electrostatic pressure on the charged particles in the plasma which overcomes the attractive forces between the dust particles thereby assisting in controlling the formation of agglomerates. Shock waves with energies of the order of 10 MeV are preferred.

Although in FIG. 2 the shock waves are generated using high pressure gas, suitable shock waves may alternatively be generated using a pulsed electron beam directed transversely of the applied RF field at an energy of around 15–20 KeV or RF injection using a separate antenna similarly directed transversely of the plasma field. Alternatively, ion acoustic waves which resonate with the plasma ions can also be used to heat the plasma ions. The ion acoustic waves are generated by a small antenna positioned at the side of the plasma.

Dust particle agglomerations may be employed to good effect in providing protection for surfaces against radiation damage. For example, dust agglomerates may be controllably formed and injected onto the walls of a fusion device which would have the effect of increasing the effective 'wall' surface area and reducing wall loading due to energetic particle and radiation flux. In the divertor region of a tokamak plasma reactor such as ITER the wall loading, due to incident energetic particles and radiation, is of the order of 5 MV/m². The intensity is great enough to cause sputtering and evaporation from the wall surfaces which produces large quantities of dust and causes erosion of the surfaces. By firstly seeding the wall surfaces with a fine dust layer of a suitable material, the method described above for controlling the formation of dust particle agglomerates may be employed to control the formation agglomerates adjacent the wall surfaces to from a protection against incident radiation and energetic particles. To form an effective barrier, the layer thickness I dust size a and density $n_d$ need to satisfy the following criteria: $n_d a^2 I > 1$. The distribution in size of the dust particles where $n_d(a) = a^{-s}$, for $s > 3$ then $\int n_d(a) a^2 da$ is determined by the dimension of the largest dust particle agglomerate.

Although not described, alternative means for altering the temperature of one particle species substantially independently of the other, may of course be employed and the methods described may be employed in alternative plasma environments without departing from the spirit of the invention described. Furthermore, thermometers and other temperature monitoring devices may be employed to monitor the temperature of individual particles species in the plasma reactor thereby enabling additional control of agglomerate formation. For example, in the case of the plasma reactor shown in FIG. 1, the temperature of the neutral gas flowing into the plasma chamber may be monitored using conventional gas temperature measures. Alternatively the temperature of particle species within the chamber may be measured using conventional temperature probes.

As described above, the formation of dust particle agglomerates can be controlled and used or prevented through appropriate control of the ratio of the temperatures of various particle species present. It will be appreciated that although two separate control criteria have been described, the control criteria in each case are associated with one another and reflect opposing extremes, i.e. (i) where the number of neutral particles is negligible and (ii) where the number of neutral particles dominate, of a common technical effect. The control criteria thus identify the dominant factors determining dust agglomeration in each environment.

What is claimed is:

1. A method of controlling dust particle agglomeration in a plasma comprising adjusting the ratio of temperatures of first and second particle species within the plasma.

2. A method as claimed in claim 1, wherein the ratio of temperatures is adjusted by increasing or decreasing the temperature of the first of the particle species without substantially altering the temperature of the second of the particle species.

3. A method as claimed in either of claims 1 wherein the ratio of neutral gas particle temperature with respect to dust particle temperature is adjusted.

4. A method as claimed in claim 3, wherein the neutral gas particle temperature is adjusted by heating or cooling the neutral gas supplied to the plasma.

5. A method as claimed in claim 3, wherein the dust particle temperature is adjusted by heating or cooling the source of the dust particles.

6. A method as claimed in claim 4, wherein the ratio of plasma ion temperature with respect to plasma electron temperature is adjusted.

7. A method as claimed in claim 6, wherein the plasma ion temperature is increased with respect to the plasma electron temperature by application of one or more transverse shock waves through the plasma.

8. A method as claimed in claim 1, further including controlling movement of dust particle agglomerates formed within the plasma.

9. A method as claimed in claim 8, wherein movement of dust particle agglomerates within the plasma is controlled by application of external electric and magnetic fields.

10. Apparatus for controlling formation of dust particle agglomerates in a plasma comprising a plasma containment vessel, a plasma generator including one or more electrodes, and a temperature controller for controlling the ratio of temperatures of first and second particle species within the plasma.

11. Apparatus as claimed in claim 10, wherein the temperature controller comprises a heat exchanger device.

12. Apparatus as claimed in claim 11, wherein the heat exchanger device is in thermal contact with a supply of neutral gas to the plasma containment vessel.

13. Apparatus as claimed in claim 11, wherein the heat exchanger device is in thermal contact with a source of dust particles.

14. Apparatus as claimed in claim 10, wherein the temperature controller includes heat radiative material located within the plasma containment vessel.

15. Apparatus as claimed in claim 10, wherein the temperature controller comprises a shock waver generator and a discharge structure for directing the shock wave through the plasma.

16. Apparatus as claimed in claim 15, wherein the shock wave generator includes a valve for controlling the period of the shock waves through the plasma.

17. A method of generating shielding for exposed surfaces in a plasma containment vessel comprising providing a source of dust particles, adjusting the ratio of temperatures of first and second particle species within the plasma to generate dust particle agglomerates and positioning the dust particle agglomerates adjacent the exposed surfaces to be shielded.

18. Apparatus for generating shielding for exposed surfaces in a plasma containment vessel comprising a source of dust particles, temperature control means for adjusting the ratio of temperatures of first and second particle species within the plasma to generate dust particle agglomerates and means for positioning the dust particle agglomerates adjacent the exposed surfaces to be shielded.

* * * * *